United States Patent

[11] 3,551,758

[72] Inventor Herbert E. Ferree
Greensburg, Pa.
[21] Appl. No. 789,836
[22] Filed Jan. 8, 1969
[45] Patented Dec. 29, 1970
[73] Assignee Westinghouse Electric Corporation
Pittsburgh, Pa.
a corporation of Pennsylvania

[54] FLUID COOLED HEAT SINK ASSEMBLY FOR PRESSURE CONTACTED SEMICONDUCTOR DEVICES
5 Claims, 7 Drawing Figs.

[52] U.S. Cl. .......... 317/234, 317/235; 165/80
[51] Int. Cl. .......... H01l 1/12
[50] Field of Search .......... 317/234, 235, 1, 4, 5, 5.4, 6, 11; 165/80(Inquired)

[56] References Cited
UNITED STATES PATENTS 3,364,987 1/1968 Bylund et al. .......... 165/80
3,416,597 12/1968 Kupferberg .......... 165/80

*Primary Examiner*—James D. Kallam
*Assistant Examiner*—R. F. Polissack
*Attorneys*—F. Shapoe and C. L. Menzemer

ABSTRACT: Leveling of one or more flat package semiconductor devices in a fluid cooled heat sink assembly is achieved by employing an electrically insulating heat sink housing having one or more flexible portions cooperating with a resilient sealing member disposed between the housing and an electrically and thermally conductive heat sink in pressure contact with each flat packaged semiconductor device. The flexible portions resiliently permit limited movement of the heat sink with respect to the semiconductor device to conform with the abutting surfaces of the device. The thermal energy created by each device is transferred by the heat sink housing. This arrangement enables not only individual semiconductor devices to be applied to contact the entire surface of a heat sink, but also enables several semiconductor devices with height differences and surface nonparallelism to be made into a satisfactory assembly.

WITNESSES

INVENTOR
Herbert E. Ferree
BY
ATTORNEY

FLUID COOLED HEAT SINK ASSEMBLY FOR PRESSURE CONTACTED SEMICONDUCTOR DEVICES

BACKGROUND OF THE INVENTION

1. Field of the Invention

This invention relates to fluid cooling of flat packaged semiconductor devices.

2. Description of the Prior Art

Rigid copper heat sinks and heat sink housings do not permit full abutting contact of nonparallel contact surfaces between the heat sinks and/or the housing and the flat package semiconductor devices wherein the devices have opposed major surfaces which may also be nonparallel with each other. In assemblies wherein a side-by-side arrangement is employed for two or more flat packaged semiconductor devices, the rigid heat sinks are very sensitive to variations both in the thicknesses of the devices and the nonparallelism of the opposed major surfaces of the devices. The result of this sensitivity is that the devices must be precisely matched for uniformity of thicknesses and the contact surfaces of the heat sinks must be lapped for parallelism. Obviously this adds greatly to the cost of the assembly.

An object of this invention is to provide a fluid cooled electrical device assembly wherein a heat sink housing has a flexible portion which permits movement of a heat sink disposed in the housing thereby aligning heat sink contact surfaces with the contact surfaces of flat packaged semiconductor devices meeting therewith.

Another object of this invention is to provide a fluid cooled device assembly for at least two spaced flat packaged semiconductor devices disposed side-by-side wherein a heat sink housing has flexible portions which permit movement of heat sinks in contact with the housing to align and mate their contact surfaces with the respective contact surfaces of the devices thereby compensating for differences in the thickness occurring between the devices and any nonparallelism of the opposed major surfaces of each device.

Other objects of this invention will, in part, be obvious and will, in part, appear hereinafter.

SUMMARY OF THE INVENTION

In accordance with the teachings of this invention there is provided a fluid cooled electrical device assembly comprising (1) two spaced opposed end plates; (2) at least one flat package semiconductor device having two major opposed flat electrically and thermally conductive contact surfaces disposed between the opposed end plates; (3) an electrically insulating heat sink housing disposed between each end plate and one contact surface of the flat package semiconductor device, each of the housings having one major surface, a cavity in another surface opposed to the major surface, the bottom of the cavity having a surface substantially parallel to the major surface and a flexible portion being present between the bottom of the cavity and the major surface (4) a plurality of electrically conductive heat sink members, each member being disposed in the cavity of the housing and abutting the surface at the bottom of the cavity and the flexible portion, the heat sink member having a flat surface extending above said another surface of the housing adapted to conform with and enter into a good pressure electrical and thermally conductive relationship with the flat contact surface of the semiconductor device, (5) means for drawing the end plates together, for retaining the components of the assembly therebetween and for applying a predetermined force to each of the flat packaged semiconductor devices; (6) resilient means disposed in at least one of the end plates to urge each of the flat packaged semiconductor devices into the electrical and thermal conductive pressure contact with the respective flat surfaces of the heat sink members and to cause flexing of the flexible portions at the bottom of the cavities of the housing to permit movement of the heat sink members to accommodate for differences in height and parallelism of the flat surfaces of the semiconductor devices in contact therewith; (7) means for circulating a fluid through each housing to extract heat from the heat sink members; and (8) means for electrically connecting the heat sink members into an electrical circuit external to the fluid cooled electrical device assembly.

DRAWINGS

For a better understanding of the nature and objects of this invention, reference should be had to the detailed drawings in which.

DESCRIPTION OF THE INVENTION

Figure 1:
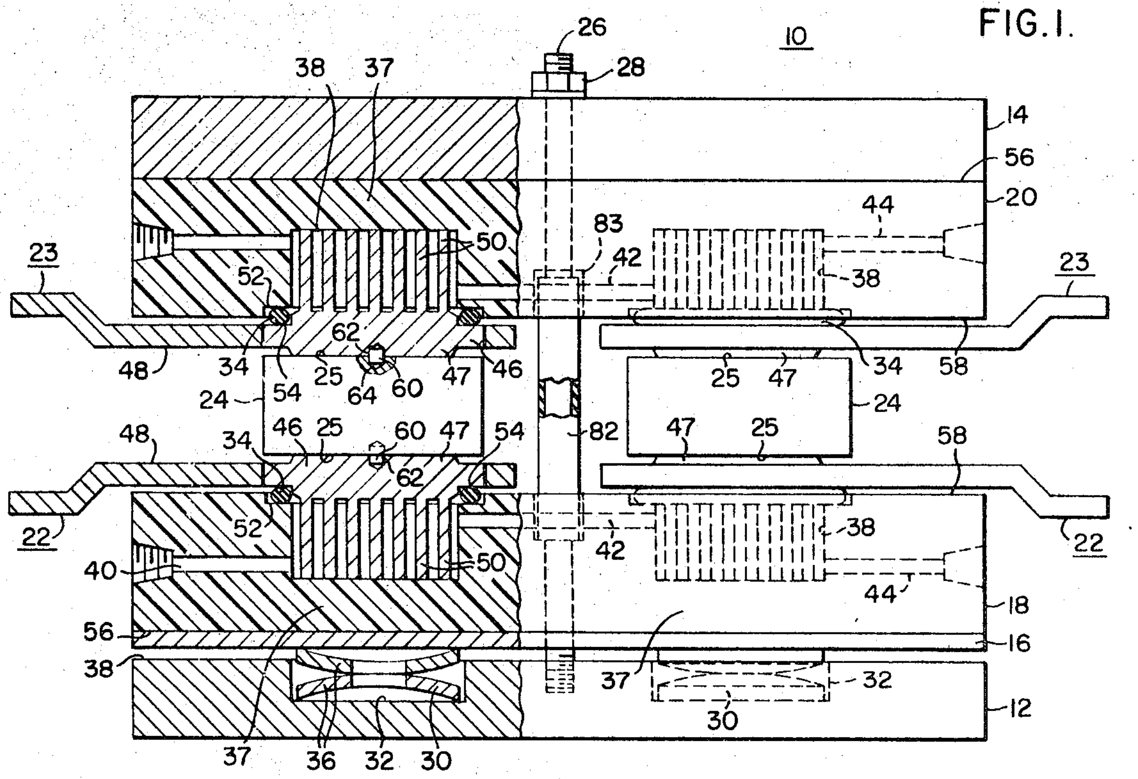
FIG. 1 is an elevation view, partly in cross section, of a fluid cooled electrical device assembly made in accordance with the teachings of this invention.

With reference to FIG. 1 there is shown a fluid cooled semiconductor device assembly 10 comprising one embodiment of the invention wherein two or more flat packaged semiconductor devices 24 are assembled. The assembly 10 comprises opposed end plates 12 and 14, bearing plate 16, electrically insulating heat sink housings 18 and 20, electrodes 22 and 23 and two flat package semiconductor devices 24, are held together by a tie rod 26 and nut 28.

The opposed end plates 12 and 14 are employed to retain the components of the assembly 10 together in a pressurized relationship with each other. The plates 12 and 14 may be made of any suitable material having a sufficient strength to retain the components therebetween. Metals, such, for example, as copper, brass, aluminum, and steel are preferred for making the plates 12 and 14 although a nonmetallic material such for example as laminated fiber glass and paper or cloth impregnated with a melamine, a phenolic, or an epoxy resinous material may also be used to make one or both of the plates 12 and 14.

Cavities 32 are formed in a surface 38 of the end plate 12 to receive resilient force means 30 therein. A cavity 32 is provided in the plate 12 for each of the flat package semiconductor devices 24 in the assembly 10. The force means 30 is suitable to provide a resilient force loading on the flat packaged semiconductor device disposed above it, along with some swivellike action for promoting a substantially uniform force loading on each of the devices 24. A suitable force means 30 consists of two truncated cone shaped spring washers 36 arranged face-to-face as shown in FIG. 1 or alternately base-to-base. Either arrangement of the spring washers 36 provides a form of swivel action for the bearing plate 16. As shown, the uppermost spring washer 36 projects above the surface 38 of the plate 12 under normal loading of the assembly 10 thereby keeping the bearing plate 16 free of the surface 38.

The bearing plate 16 provides alignment of the spring washers 36 and together with the end plates 12 and 14 the tie rod 26 and the nut 28, forms a part of the clamping system for the loading of the assembly 10. The bearing plate 16 has some flexibility and assists in distributing the force loading uniformly over the bottom surface of a flexible portion 37 of the housing 18 and also prevents the edges of the spring washers 36 from imbedding themselves in the softer material of the housing 18. The bearing plate 16 is flexible enough to permit effective leveling of the device 24.

The electrically is insulating heat sink housings 18 and 20 each have a flat bottomed cavity 38 for each flat package semiconductor device 24 in the assembly 10. Passageways 40, 42, and 44 are provided in each insulating member 18 and 20 for circulating a coolant medium through each cavity 38 to extract the heat produced by the operation of the devices 24.

A suitable material for the electrically insulating heat sink housings 18 and 20 is a moderately flexible material particularly harder rubber and resins such, for example, as polyvinyl chloride, hard rubber and laminated fiber glass, cloth and paper materials impregnated with a melamine resin, a phenolic resin, or an epoxy resin, or molded epoxy resins filled with powders and/or fibrous materials. These materials should withstand the temperatures of use, namely, up to about 125° C. continuous rating.

The electrically insulating members 18 and 20 provide a means for separating the electrodes 22 and 23 from the end plates 12, thereby enabling the assembly to operate at high current ratings. In instances where the assembly utilizes two flat packaged semiconductor devices 24, the assembly can be connected into external electrical circuits to form of an AC switch, a voltage doubler, or a current doubler.

Each electrode 22 and 23 comprises an electrically and thermally conductive portion 46 which is either integral with or is suitably affixed by a low resistance electrically conductive joint to, the remaining portion of the electrodes 22 and 23. The electrically and thermally conductive portion 46 forms an electrically conductive heat sink member which has a raised portion 47 with a flat surface in a good electrically and thermally conductive relationship with a flat end surface 25 of each respective device 24. The heat sink member 46 of each electrode 22 has a plurality of fin members 50 extending downwardly into the respective cavity 38 of the respective member 18 or 20. A resilient sealing gasket member 34 is disposed between the heat sink member 46 and the respective member 18 or 20. The member 34 is disposed about the fin members 50 and is in contact both with a peripheral shoulder 54 of the heat sink member 46 and with a recessed peripheral shoulder 52 at the upper portion of the cavity 38 of the respective member 18 or 20.

The fin members 50 are of a sufficient length to resiliently contact the flat bottom surface of the cavity 38 thereby urging the electrodes 22 into a good pressurized electrical and thermal contact with the device 24 while simultaneously deforming the resilient member 34 sufficiently to form a fluid tight seal between the electrode 22 and the respective member 18 or 20. The resilient member 34, although deformed, however, projects above the top surface 58 of the respective member 18 or 20 to permit operation of the self-leveling feature of the electrodes 22 and 23 to compensate for the difference in height occurring between the devices 24 of the assembly 10 and any nonparallelism of the opposed major surfaces 25 of each device 24.

The members 18 and 20 are designed to provide a suitably thick resilient portion 37 between a bottom surface 56 of either of the members 18 and 20 and the bottom surface of the respective cavities 38. These portions 37 are resilient enough to permit a slight deformation of the bottom of the cavities 38 by fins 50 in order to align the contiguous contact surfaces 47 of the respective electrodes 22 and 23 and the flat surfaces 25 of the devices thereby transmitting substantially uniformly through each fin member 50 the force necessary for a good pressurized electrically and thermally conductive contact between the electrodes 22 and 23 and the devices 24. Coolant fluid is circulated through passageways 40, 42, and 44 and the cavities 38 of the members 18 and 20 and about the fin members 50 to extract the heat being conducted thereby from the devices 24.

The devices 24 are retained between the pairs of electrodes 22 and 23 by the pressure exerted through them. In order that lateral shifting of the devices 24 be restricted, and that each device 24 be centered properly between a pair of electrodes 22 and 23, a pin 60 is disposed in a recess 62 of each electrode 22 and 23 to fit into a mating recess 64 in each major surface of the device 24.

Figure 4:
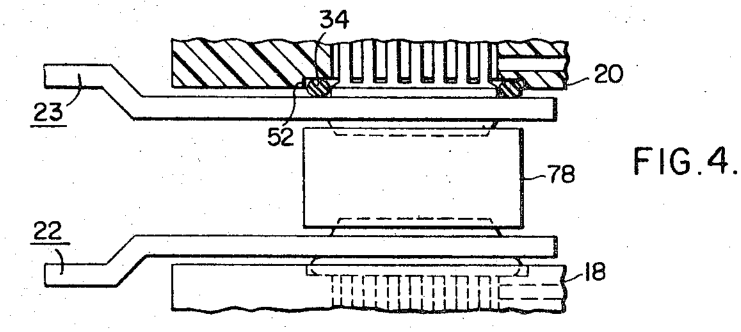
FIG. 4 is a view, partly in cross section, of a modification of another portion of the assembly of FIG. 1.

Referring now to FIG. 4 there is shown a modification of the electrodes 22 and 23 to accommodate a flat packaged semiconductor device 78 having recessed opposed surfaces as compared to the flat surfaces 23 of device 24. The electrodes 22 and 23 are contoured to accommodate the device 78 by forming a pedestal upon which the device 78 is disposed. The pedestal helps to center the device 78 and restricts its lateral movement.

Again referring to FIG. 1 the components of the assembly are retained in place by the tie rod and the nut 28. The tie rod extends through apertures in the end plate 14, the insulating members 20 and 18, the bearing plate 16, and threadedly engages the other end plate 12. This type of arrangement orients the components with each other very satisfactorily. Alternately, the tie rod 26 can extend through an aperture through the end plate 12 and be engaged by a nut also in the other end. After the components of the assembly 10 are appropriately stacked together, a pressure can be applied to the end plate 14 and retained while the nut 28 is threaded onto the tie rod 26. A pressure gauge is applied to the surface of the end plate 14, or the nut 28 is turned by a torque wrench until the reading on the pressure gauge or torque wrench, or both is at the desired amount. This assures one that the tie rod 26 and the nut 28 are properly applying the desired loading to the components of the assembly 10. Usually a pressure of the order of 50 to 1000 p.s.i. on the flat surface 47 is adequate.

Although only one tie rod 26 may be used in the assembly 10, good results were had with a minimum number of two tie rods. To prevent arcing between the tie rods 26 and the electrodes 22 and 23 it is preferred that a hollow electrically insulating sleeve member 82 be disposed over the exposed portion of the tie rod 26 between the opposed insulating members 18 and 20 and preferably extends into a cavity 83 in each member 18 and 20. The sleeve member 82 is designed and constructed as not to prevent the insulating members 18 and 20 from being drawn together sufficiently.

The assembly 10 can be mounted directly upon other metal surfaces such as rectifiers since the devices 24 are fully electrically insulated from the opposed end plates 12 and 14.

If current leakage through the coolant fluid should prove to be a problem it can be eliminated simply by coating the surfaces of the fins 50 with an electrically insulating material such as a varnish or wire enamel or an aluminum oxide coating on aluminum fins, or a fused glass coating.

Figure 2:
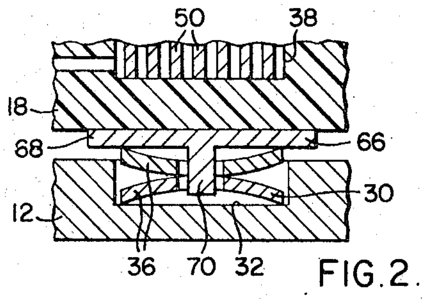
FIGS. 2 and 3 are fragmentary elevation views in cross section of modifications of a portion of the assembly of FIG. 1.

Referring now to FIG. 2 there is shown a modification of the force means 30 and the bearing plate 16 to distribute the applied force of the assembly to selected portions of the electrically insulating heat sink housing 18. The bearing plate 16 has been replaced with a "toadstool" shaped member 66 which is used with each force means 30 in the plate 12. The member 66 has a wide flat member portion 68 which acts as a thrust member for the force means 30 and uniformly distributes a part of the applied force of the assembly 10 over the surface of a flexible portion of the housing 18. The member 66 is preferably made of a metal, such for example, as steel, aluminum and the like, although a nonmetallic material may also be employed.

The member 66 also has a stem portion 70 which projects downwardly through the apertures of the spring washers 36. The stem portion 70 is long enough to extend below the inner surface of the lower spring washer 36 and is short enough not to bottom on the bottom surface of the cavity 32 when the components are assembled and the designed operating force loading is applied. The stem portion 70 has an outer periphery sufficiently less than the inner periphery of the apertures of the spring washers 36 in order that the swivel action of the washers 36 is retained in the assembly 10.

Figure 3:
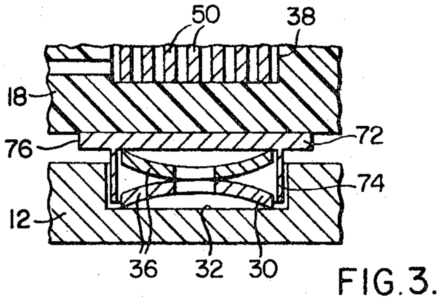

With reference to FIG. 3 there is shown another modification of the force means 30 and the plate 16 for distributing the applied force to a selected portion of the assembly 10. Again the bearing plate 16 has been removed and a caplike member 72 used in conjunction with each force means 30 in the plate 12. The member 72 has a tubular portion 74 which is disposed about the outer periphery of the spring members 36 and a flat member 76 sealing one end of the tubular portion 74. The flat member 76 acts as a thrust member for the spring washers 30 and uniformly distributes a portion of the applied force of the assembly 10 over the surface of a flexible portion of the electrically insulating heat sink housing 18. Preferably, therefore, the member 72 is made of steel, aluminum, and the like.

The tubular portion 74 is long enough to extend below the top surface of the lower spring washer 36 and is short enough to the bottom surface of the cavity 32 when the components are assembled and the designed force loading is applied. Enough clearance may be obtained by incorporating a pedestal portion in the bottom of the cavity 32 thereby permitting a greater length of travel for the tubular portion 74. Clearance is provided between the walls of the cavity 32, the tubular portion 74 and the spring washers 36 so as not to interfere with the desired swivel action of the spring washers 36. Alternately, the cavity 32 is eliminated and the member 72 and the spring washers 36 are disposed between the housing 18 and the plate 12.

Because of problems arising from the extent and the distribution of force loads on the devices 24, it is preferred that the number of devices 24 in the assembly 10 should not exceed three. A more versatile arrangement for the assembly 10 is to employ only two of the devices 24 arranged either in an AC switch configuration, in a series electrical circuit arrangement, or in a parallel electrical circuit arrangement.

Figure 5:
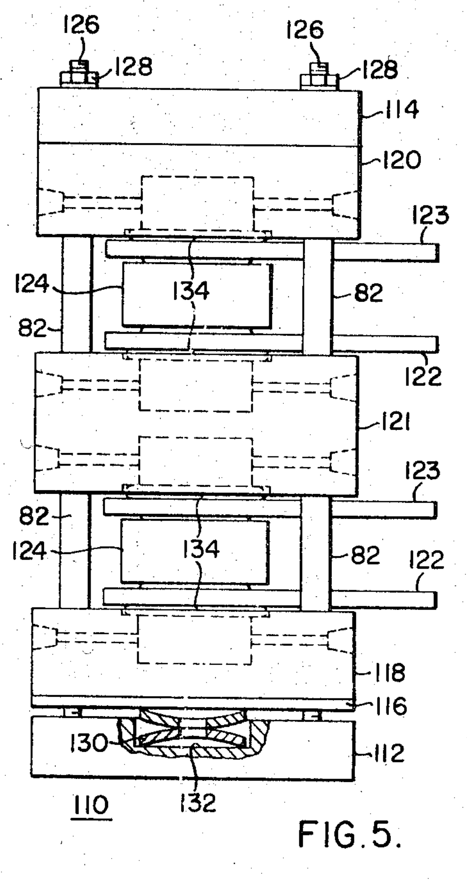
FIGS. 5 and 6 are elevation views, partly in cross section, of stacking modules made in accordance with the teachings of this invention.

Referring now to FIG. 5 there is shown a stacking module 110 which is a modification of the assembly 10 and embodies the compensating and self-leveling fluid cooled heat sink assembly of this invention. The stacking module 110 comprises opposed end plates 112 and 114, a bearing plate 116, electrically insulating members 118, 120 and 121, electrodes 122 and 123, two flat packaged semiconductor devices 124, tie rods 126, nuts 128, resilient force means 130 disposed in a cavity 132 of the end plate 112, and resilient members 134. Components corresponding to those of the assembly 10 are made of the same materials function in the same manner, and have the same configuration and modifications as described heretofore. The only difference between the assembly 10 and module 110 is that in the latter the semiconductor devices 24 are stacked one upon the other and an additional insulating member 121 is interposed to accomplish fluid cooling of both of the devices 24 from one side of each. While two rods 126 are shown, in practice three or four are preferably used to secure better pressure distribution on the devices.

The insulating members 118, 120 and 121 are made of the same materials as the members 18 and 20 of FIG. 1. The member 121 has a cavity 138 formed in both of its major surfaces, however, and the same configuration of the electrodes 122 and 123 and the cavities 138 are used to achieve fluid cooling of the devices 124 as well as the use of the members 134 in the same manner as before to achieve compensation and leveling of the devices 124.

The stacking module 110 may have any number of flat package electrical devices disposed between the end plates 112 and 114 and cooled from both sides.

Alternately, when the devices 124 are in a series electrical circuit, the member 121 may be made of electrically conductive material like copper as is the devices 124 need not be electrically insulated from each other.

Figure 6:
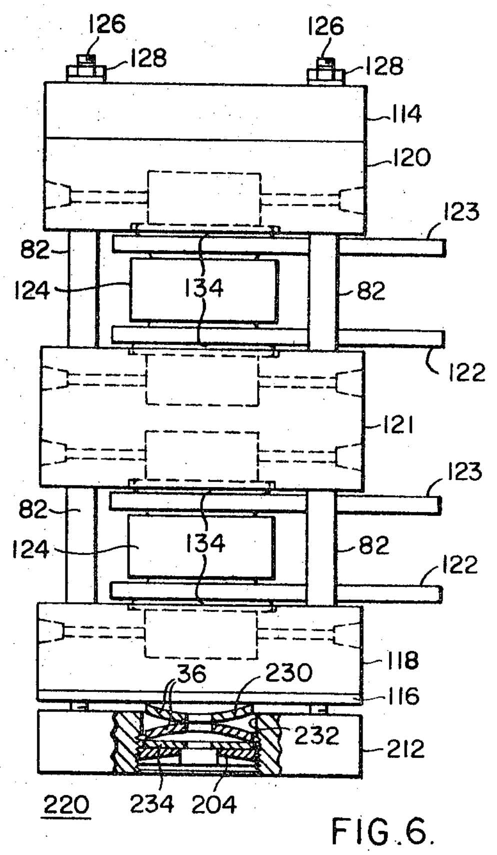

FIG. 6 is a stacking module 200 which is a modification of the stacking module 110. All the components are the same as those in the stacking module 110 except for modifications made in the end plate 12 and the resilient force means 30.

The resilient force means 30 has been modified to provide for a readily adjustable force means 230 disposed in an end plate 212 which is the same as the end plate 12 except that a partially threaded aperture 232 extending through the entire thickness of the plate 212 has replaced the cavity 32 of the plate 12.

The readily adjustable force means 230 comprises the cone shaped spring washers 36 disposed in the aperture 232 in the same manner as they were previously disposed in the cavity 32. A thrust washer 234 is disposed on the spring washer 36 most remote from the bearing plate 16. An externally threaded nut 204 engaging the threaded portion of the aperture 232 is employed for retaining the components of the module 200 together and as a means for adjusting and maintaining the force developed by the spring washers 36 necessary to retain the good electrically and thermally conductive relationship between the respective components of the module 200.

The electrical circuit arrangements previously described as possible with the assembly 10 are also possible with either one of the stacking modules 110 and 200.

Figure 7:
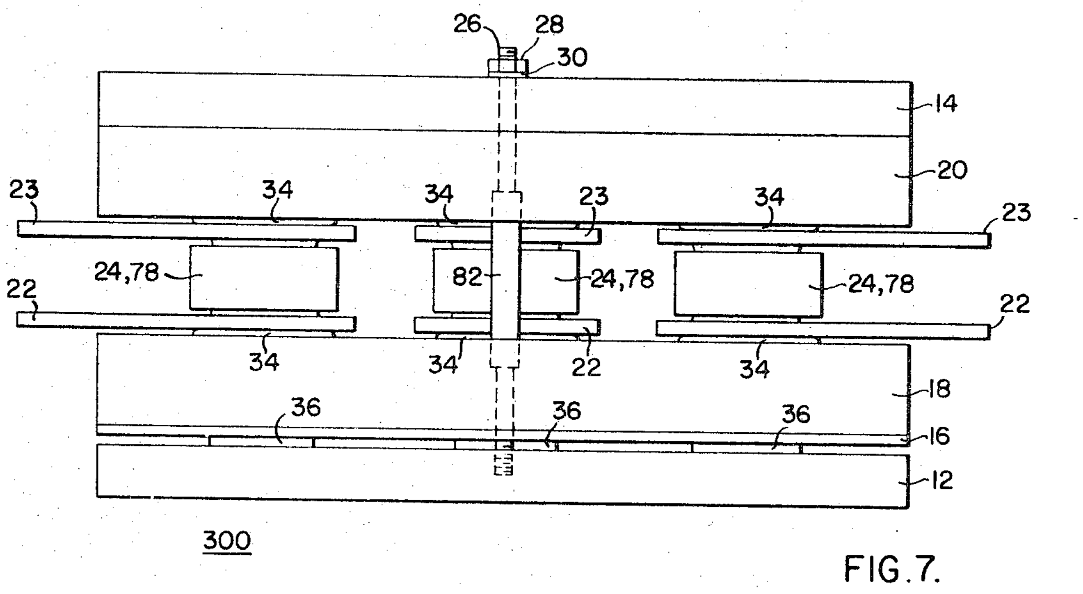
FIG. 7 is an elevation view of a modification of the fluid cooled electrical device assembly of FIG. 1.

With reference to FIG. 7 there is shown an assembly 300 which is another modification of the assembl y 10. All of the components of the assembly 300 are exactly the same as that previously described in relation to the assembly 10 except that three of the devices 24 or 78 are employed in assembly 300 and only one tie rod 26 is required.

A water cooled electrical device as shown in FIG. 1 was constructed in accordance with the teachings of this invention. The plates 12 and 14 were made of five-eighths inches thick aluminum. The electrically insulating housings 18 and 20 were made of molded polyvinylchloride resin. The resilient members 34 were O-rings made of a synthetic rubber comprising a copolymer of hexafluoropropylene and vinylidene fluoride. The bearing plate 16 was made of one-sixteenth inches thick aluminum. Two flat package semiconductor devices rated at 600 amperes each comprised the devices 24. One device was 1.03 inches in thickness and its contact surfaces were 0.004 inch out of parallel. The second device was 1.06 inches in thickness and its contact surfaces were 0,003 inch out of parallelism.

The electrodes 22 and 23 were made in two pieces and brazed together and nickel plated. The portions 46 were made of an alloy of tellurium and copper with the fin members 50 machined as an integral part thereof. The remainder of each electrode was made of electrolytic copper. A short pin of one-eighth inches diameter copper rod inserted in the heat sink 46 and fitting into an opening 64 aligned the electrodes 22 and 23 with the respective devices 24.

The two tie rods 26 were of type 304 stainless steel, and was fully threaded. The nuts 28 and washers were made of nickel plated brass. The spring washers 36 were Belleville spring washers. The insulator sleeve member 82 was made of a glass fiber cloth impregnated with an electrically insulating epoxy resin and meeting the electrical requirements of the electrical industry standard of NEMA G-5.

The components were assembled as shown in FIG. 1 and the tie rods 26 threaded into the plate 12. A pressure of 4000 pounds as indicated by a gauge, was applied to the plate 14 and a washer placed over the end of each tie rod 26 and the nut threadedly engaged each rod 26 and run down until the pressure gauge indicated that the rods has taken a load of 3950 pounds which load was applied through springs 36 to the semiconductor devices 24. Each device 24 had a force load of essentially 2000 pounds applied to it to form a good pressurized electrical and thermal contact with the respective electrodes 22 and 23.

Water at 30° C. and flowing at a rate of 1 gallon per minute was caused to circulate through each of the electrically insulating heat sink housings. Under normal electrical operating conditions, the cooling rate was sufficient to remove 1600 watts or 400 watts per heat sink. Each device 24 performed excellently in accordance with design electrical characteristics.

Further investigation showed that for the same devices as used in the previous example, in the assembly 10, the assembly was able to employ flat package semiconductor devices having as great as 0.006 inch total difference in thickness between them and as great as 0.010 inch difference in parallelism between opposite ends of the contact surfaces of a device.

It will be appreciated that in the preferred modification, while the bottom of cavity 38 is flat and the ends of fins 50 are flat to fit thereagainst, the bottom can be rounded concavely or convexly or depart from flatness by a modest extent, and the fins 50 suitably machined to abut thereagainst.

I claim:

1. A fluid cooled electrical device assembly comprising:

1. two spaced opposed end plates;
2. at least one flat package semiconductor device having two major opposed flat electrically and thermally conductive contact surfaces disposed between the opposed end plates;
3. an electrically insulating heat sink housing disposed between each end plate and one contact surface of the flat package semiconductor device, each of the housings having one major surface, walls defining a cavity in another surface opposed to the major surface, the bottom of the cavity having a surface substantially parallel to the major surface, and a flexible portion being present between the bottom of the cavity and the major surface;
4. a plurality of electrically conductive heat sink members, each member being disposed in the cavity of the housing and abutting the surface at the bottom of the cavity and the flexible portion, the heat sink member having a flat surface extending above said another surface of the housing adapted to conform with and enter into a pressure electrical and thermally conductive relationship with the flat contact surface of the semiconductor device;
5. means for drawing the end plates together for retaining the components of the assembly therebetween, and for applying a predetermined force to each of the flat package semiconductor devices;
6. resilient means disposed in at least one of the end plates to urge each of the flat package semiconductor devices into the el ectrical and thermal conductive pressure contact with the respective flat surfaces of the heat sink members and to cause flexing of the flexible portions at the bottom of the cavities of the housing to permit movement of the heat sink members to accommodate for differences in height and parallelism of the flat surfaces of the semiconductor devices;
7. means for circulating a fluid through each housing to extract heat from the heat sink members; and
8. means for electrically connecting the heat sink members into an electrical circuit external to the fluid cooled electrical device assembly.

2. The fluid cooled electrical device assembly of claim 1 in which each electrically conductive heat sink member has a plurality of fin members projecting into a cavity of an electrically insulating heat sink housing whereby the thermal energy dissipated to the member of a device is extracted by the fluid circulating through the housing.

3. The fluid cooled electrical device assembly of claim 1 in which said flat packaged semiconductor devices are disposed in a spaced side-by-side relationship between said opposed end plates.

4. The fluid cooled electrical device assembly of claim 1 in which: other;

said flat-packaged semiconductor devices are in a vertical axial alignment with respect to each other;

a second type of an electrically insulating housing disposed between each pair of adjacent devices, each of said second type housing having a flexible portion disposed between and acting on each of two electrically conductive heat sink members in a pressure electrical and thermally conductive relationship with one of the two adjacent devices; and means for circulating a fluid through each second type housing to extract thermal energy dissipated to each heat sink member by the device in a thermally conductive relationship therewith.

5. The fluid cooled electrical device assembly of claim 4 in which said means to resiliently urge each of the flat-packaged semiconductor devices into the pressure electrical and thermally conductive relationship with the respective heat sink members is readily adjustable.